(12) United States Patent
Urimoto et al.

(10) Patent No.: US 11,540,401 B2
(45) Date of Patent: Dec. 27, 2022

(54) ELECTRONIC CONTROL DEVICE

(71) Applicant: Mitsubishi Electric Corporation, Tokyo (JP)

(72) Inventors: Kentaro Urimoto, Tokyo (JP); Akira Kimishima, Tokyo (JP); Takahisa Kawaguchi, Tokyo (JP); Takanori Ichikawa, Tokyo (JP)

(73) Assignee: Mitsubishi Electric Cornoration, Tokyo (JP)

( * ) Notice: Subject to any disclaimer, the term of this patent is extended or adjusted under 35 U.S.C. 154(b) by 88 days.

(21) Appl. No.: 17/048,802

(22) PCT Filed: Aug. 2, 2018

(86) PCT No.: PCT/JP2018/028969
§ 371 (c)(1),
(2) Date: Oct. 19, 2020

(87) PCT Pub. No.: WO2020/026398
PCT Pub. Date: Feb. 6, 2020

(65) Prior Publication Data
US 2021/0153367 A1     May 20, 2021

(51) Int. Cl.
*H05K 5/00*     (2006.01)
*H01R 12/58*    (2011.01)

(52) U.S. Cl.
CPC ........... *H05K 5/0069* (2013.01); *H01R 12/58* (2013.01); *H05K 5/0047* (2013.01)

(58) Field of Classification Search
CPC ..... H05K 5/0069; H05K 5/0047; H01R 12/58
USPC ....................................................... 439/76.1
See application file for complete search history.

(56) References Cited

U.S. PATENT DOCUMENTS

| | | | | |
|---|---|---|---|---|
| 9,277,658 | B2 * | 3/2016 | Tanaka | H05K 5/0043 |
| 2015/0056845 | A1 * | 2/2015 | Tanaka | H05K 5/0043 |
| | | | | 439/377 |
| 2016/0174393 | A1 | 6/2016 | Asao et al. | |

FOREIGN PATENT DOCUMENTS

JP            5936782 B2    6/2016

OTHER PUBLICATIONS

International Search Report for PCT/JP2018/028969 dated Oct. 23, 2018 [PCT/ISA/210].
Written Opinion for PCT/JP2018/028969 dated Oct. 23, 2018 [PCT/ISA/237].

* cited by examiner

*Primary Examiner* — Peter G Leigh
(74) *Attorney, Agent, or Firm* — Sughrue Mion, PLLC; Richard C. Turner

(57) ABSTRACT

An electronic control device includes first extended terminals extended from a multiple of terminals of opposing connectors respectively and second extended terminals extended from opposing control boards respectively. A hole is formed between the opposing connectors in a connector case, each of the first extended terminals and each of the second extended terminals oppose and approach each other toward the hole, in addition to which first extended terminals and second extended terminals are formed heading toward an exterior of the connector case from the hole, and the first extended terminal and the first extended terminal come into contact with differing side faces of the second extended terminal and the second extended terminal.

20 Claims, 7 Drawing Sheets

ELECTRONIC CONTROL DEVICE

CROSS-REFERENCE TO RELATED APPLICATION

This application is a National Stage of International Application No. PCT/JP2018/028969 filed Aug. 2, 2018.

TECHNICAL FIELD

The present application relates to an electronic control device.

BACKGROUND ART

An existing electronic control device, particularly a vehicle-use electronic control device, incorporates a control board on which a large number of electronic parts are mounted, and a multiple of connectors having a large number of terminals are provided in the control device in order to install power supply, ground, and various kinds of signal line from the vehicle side in the control device. In order to mount such a control device in a vehicle, the control device is constantly required to be small and light, and various improvements have been made.

A device disclosed in, for example, Patent Literature 1 is such that a reduction in size is achieved by integration of a motor acting as an actuator and a control unit, and the control unit is a stacked structure of a connector, an intermediate member, a control board, a relay member, and a drive circuit, as seen from a flow of electricity.

In particular, electrical wiring from a signal-use connector to the control board is such that a signal-use conducting bar is extended from a connector terminal, reaching a signal-use terminal, while a signal-use conducting bar extending vertically from the control board reaches as far as a connector case exterior, and the terminals are connected (welded) together.

CITATION LIST

Patent Literature

Patent Literature 1: Japanese Patent No. 5,936,782

SUMMARY OF INVENTION

Technical Problem

However, a relationship between the control board and the connector is not always that the two are disposed in such a way that connection can be carried out easily, as is the case with the device disclosed in Patent Literature 1, and in the case of a device wherein the control board and the connector are disposed distanced in separate sets, a way of connecting the two needs to be devised, and there is a need to improve machinability.

The present application provides an electronic control device that reduces the problem of the heretofore described existing device, and can respond to a need to not only reduce size, but also improve machinability.

Solution to Problem

An electronic control device disclosed in the present application is an electronic control device having a connector case, connectors disposed opposing in an exterior of the connector case and each having a multiple of terminals, and control boards disposed opposing in an interior of the connector case, and is characterized by including first extended terminals extended from the multiple of terminals of the respective opposing connectors, and second extended terminals extended from the respective opposing control boards, wherein a hole is formed between the opposing connectors in the connector case, each of the first extended terminals and each of the second extended terminals oppose and approach each other toward the hole, and first externally extending terminals (6$a$2 and 8$a$1) of the first extended terminals (6$a$1 and 8$a$) and second externally extending terminals (6$b$2 and 8$b$1) of the second extended terminals (6$b$1 and 8$b$) are formed to penetrate the hole and exit to the exterior of the connector case from the hole, and pairs of the first externally extending terminals (6$a$2 and 8$a$1) contact each other along first side faces thereof, and pairs of the second externally extending terminals (6$b$2 and 8$b$1) contact each other along second side faces thereof that are opposite the first side faces.

According to the electronic control device disclosed in the present application, connection of contact portions of each of a first extended terminal and a second extended terminal becomes easier, and machinability improves. Also, the contact portions are collected on a line that can be considered to be a straight line, whereby machinability can be improved.

Objects, characteristics, aspects, and advantages of the present application other than those heretofore described will be further clarified by the following detailed description of the present application, which refers to the drawings.

DESCRIPTION OF EMBODIMENTS

Figure 1:
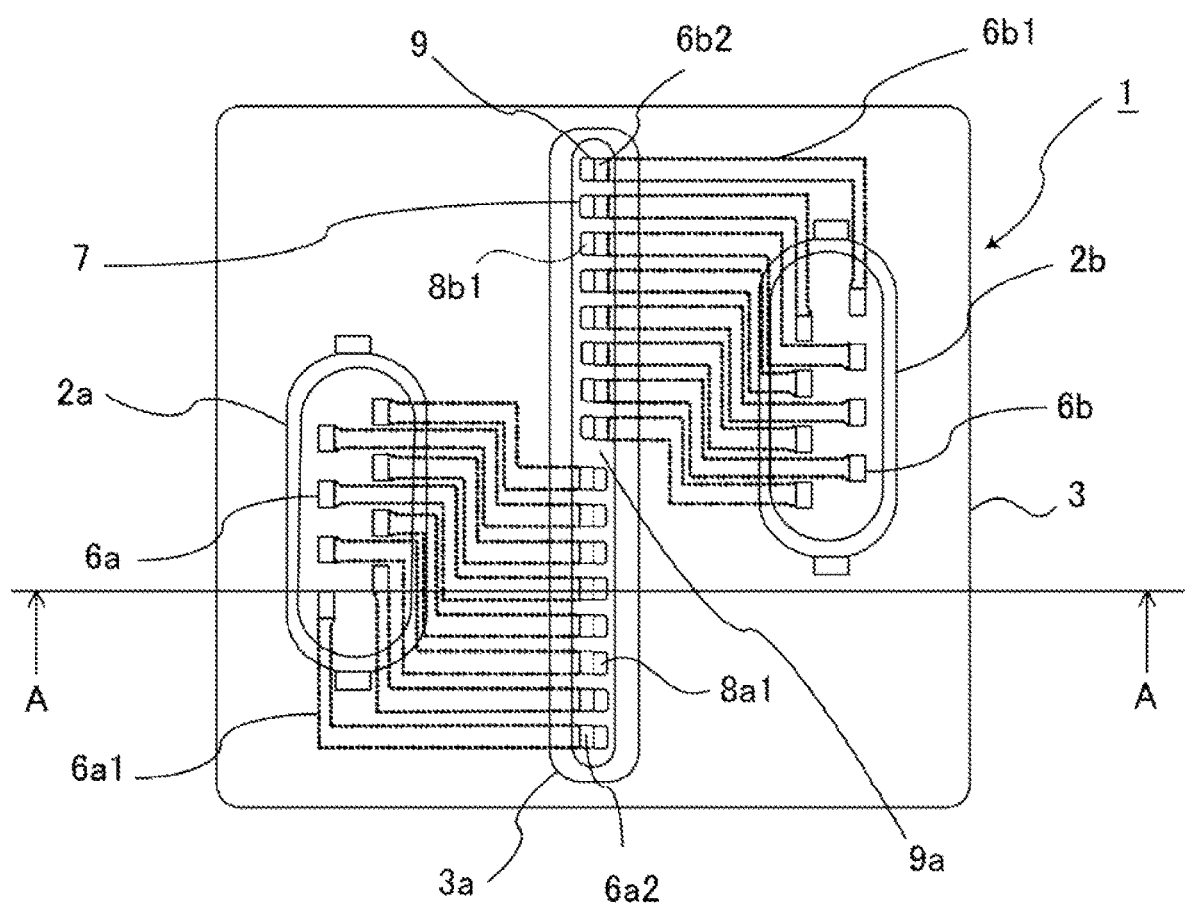
FIG. 1 is a planar perspective view showing a configuration of an electronic control device according to a first embodiment.

Hereafter, preferred embodiments of an electronic control device according to the present application will be described, using the drawings. In the drawings, identical reference signs indicate identical or corresponding portions.

First Embodiment

Figure 2:
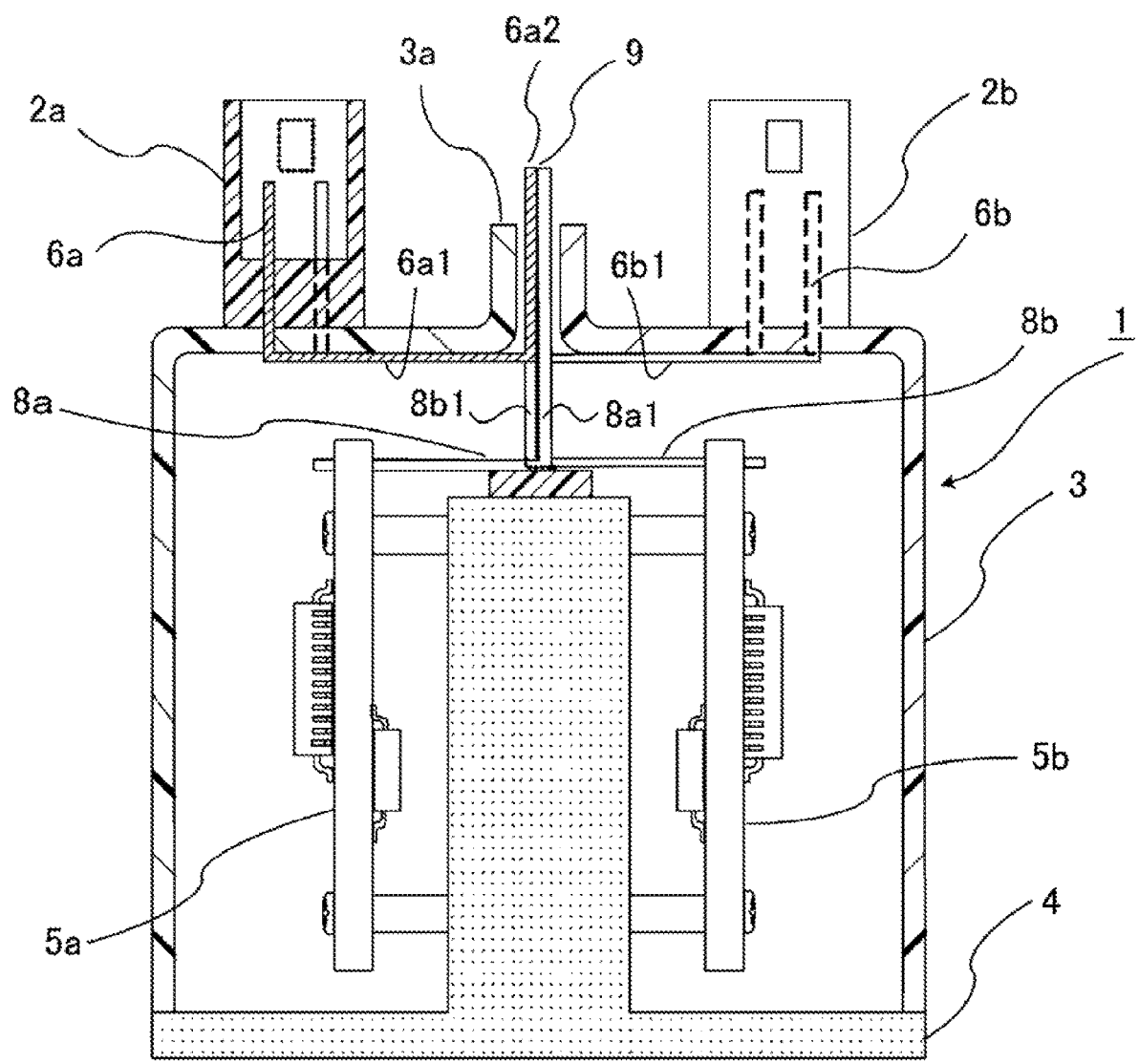
FIG. 2 is a sectional view along A-A of FIG. 1.

FIG. 1 is a planar perspective view showing a configuration of an electronic control device according to a first embodiment, and FIG. 2 is a sectional view along A-A of FIG. 1. In FIG. 1 and FIG. 2, an electronic control device 1 includes connectors 2$a$ and 2$b$, a connector case 3, and a base 4, in addition to which control boards 5$a$ and 5$b$ are included corresponding to the connectors 2$a$ and 2$b$ in an interior of the connector case 3. The connectors 2a and 2b are included on an outer side of the connector case 3.

A power supply or a signal is input into and output from the connectors 2a and 2b, and wires thereof are connected to the control boards 5a and 5b respectively. Although the pair of connectors 2a and 2b and the pair of control boards 5a and 5b are shown in FIG. 1 and FIG. 2, a multiple of connectors are disposed in the electronic control device 1, and a multiple of control boards connected via connector terminals of the connectors are also disposed. That is, although the connectors and the control boards each form a group configuration formed of a multiple thereof, two of each, those being the connectors 2a and 2b and the control boards 5a and 5b, are described as pairs in the following description of the present application.

The electronic control device 1 configured as heretofore described, with particular regard to the wires from the connectors 2a and 2b to the control boards 5a and 5b, is such that size can be reduced, and furthermore, machinability can be improved, by devising a way to dispose and connect the wires. A specific example thereof will be described hereafter.

A large number of connector terminals 6a and 6b exist in the connectors 2a and 2b, and in order to wire from each connector terminal to the control boards 5a and 5b, firstly, first extended terminals 6a1 and 6b1 extend from the connector terminals 6a and 6b to a hole 7 formed in an elliptical shape in a center of a top plate portion of the connector case 3. Further, the first extended terminals 6a1 and 6b1 head toward an upward exterior, become first externally extending terminals 6a2 and 6b2 further upward than a wall portion 3a disposed protruding from the hole 7 in a periphery of the hole 7, and are exposed, forming exposed faces of the same height. A length direction sectional form of the first extended terminals 6a1 and 6b1 is a quadrilateral form, and the hole 7 formed in the center of the top plate portion of the connector case 3, and the wall portion 3a disposed protruding in a periphery of the hole 7, are formed in an elliptical form, as seen in FIG. 1, but not being limited to this, the hole 7 and the wall portion 3a may also be rectangular. That is, the hole 7 is formed so as to have a long diameter in a direction perpendicular to a direction in which the first externally extending terminals 6a2 and 6b2 or second externally extending terminals 8a1 and 8b1 are opposed. Also, the first extended terminals 6a1 and 6b1 are configured of the same member as the connector terminals 6a and 6b respectively, and are desirably formed to be bent.

Meanwhile, second extended terminals 8a and 8b extend from upper end portions of the control boards 5a and 5b respectively in such a way as to approach each other, are bent upward in a vicinity of a center, and become the second externally extending terminals 8a1 and 8b1, which penetrate the hole 7 and extend further upward than the wall portion 3a of the connector case 3. Foremost end portions of the second externally extending terminals 8a1 and 8b1 are exposed further upward than the wall portion 3a of the connector case 3, forming exposed faces of the same height as the first externally extending terminals 6a2 and 6b2. The second externally extending terminals 8a1 and 8b1 of the second extended terminals 8a and 8b approach the first externally extending terminals 6a2 and 6b2 respectively of the first extended terminals 6a1 and 6b1 to such an extent as to come into contact. Further, the first externally extending terminal 6a2 and the second externally extending terminal 8a1, and the first externally extending terminal 6b2 and the second externally extending terminal 8b1, are connected by welding, soldering, or the like, thereby forming an electrical connection.

When connecting by welding, soldering, or the like, a connection process is easy when contact portions 9 of each of the two extended terminals, that is, the first extended terminals 6a2 and 6b2 and the second externally extending terminals 8a1 and 8b1, are disposed on a line that can be considered to be a straight line (hereafter called an approximate straight line), as shown in the planar perspective view of FIG. 1. Therefore, in order that the contact portions 9 are on an approximate straight line, the first extended terminal 6a1 is extended as far as a left side in FIG. 1 and FIG. 2 with respect to the central contact portion 9, and bent, and the other first extended terminal 6b1 is extended as far as a right side in FIG. 1 and FIG. 2 with respect to the central contact portion 9, and bent. Also, the second extended terminal 8a is extended as far as the right side in FIG. 1 or FIG. 2 with respect to the contact portion 9, and bent, and the other second extended terminal 8b is extended as far as the left side in FIG. 1 or FIG. 2 with respect to the central contact portion 9, and bent.

That is, rather than being on a straight line, upper end portions of the second extended terminal 8a and the second extended terminal 8b are such that a separating portion 9a exists in accordance with a difference in a direction perpendicular to a direction in which the connectors 2a and 2b or the control boards 5a and 5b are opposed, that is, a difference in a direction perpendicular to the direction in which the first externally extending terminals 6a2 and 6b2 or the second externally extending terminal 8a1 and the second externally extending terminal 8b1 are opposed, as shown in the planar perspective view of FIG. 1, and owing to the separating portion 9a, the contact portions 9 of the first externally extending terminal 6a2 and the second externally extending terminal 8a1 and the contact portions 9 of the first externally extending terminal 6b2 and the second externally extending terminal 8b1 are aligned on an approximate straight line. The heretofore described configuration is such that a cover that covers leading end portions of the first externally extending terminals 6a2 and 6b2, leading end portions of the second externally extending terminals 8a1 and 8b1, the hole 7, and an upper face of the wall portion 3a can be disposed.

Although each of the first extended terminals 6a1 and 6b1 and the second extended terminals 8a and 8b, and each of the first externally extending terminals 6a2 and 6b2 and the second externally extending terminals 8a1 and 8b1, form a group configuration, these are described above as the first extended terminals 6a1 and 6b1, the second extended terminals 8a and 8b, the first externally extending terminals 6a2 and 6b2, and the second externally extending terminals 8a1 and 8b1.

As heretofore described, the electronic control device 1 according to the first embodiment is such that in order to connect the opposing connectors 2a and 2b and the opposing control boards 5a and 5b using the first extended terminals 6a1 and 6b1 and the second extended terminals 8a and 8b respectively, the first externally extending terminals 6a2 and 6b2 and the second externally extending terminals 8a1 and 8b1 are drawn out in a vicinity of a center of the two, and furthermore, horizontal extended lengths of the first extended terminals 6a1 and 6b1 and the second extended terminals 8a and 8b are changed in order that the contact portions 9 of each of the first externally extending terminals 6a2 and 6b2 and the second externally extending terminals 8a1 and 8b1 are on an approximately straight line. Because of this, connection of the contact portions 9 of each of the first externally extending terminals 6a2 and 6b2 and the second externally extending terminals 8a1 and 8b1 becomes easier, and machinability improves. Also, although a large number of contact portions exist, the contact portions 9 are collected on an approximate straight line, whereby machinability can be improved.

Second Embodiment

Next, an electronic control device according to a second embodiment will be described.

Figure 3:
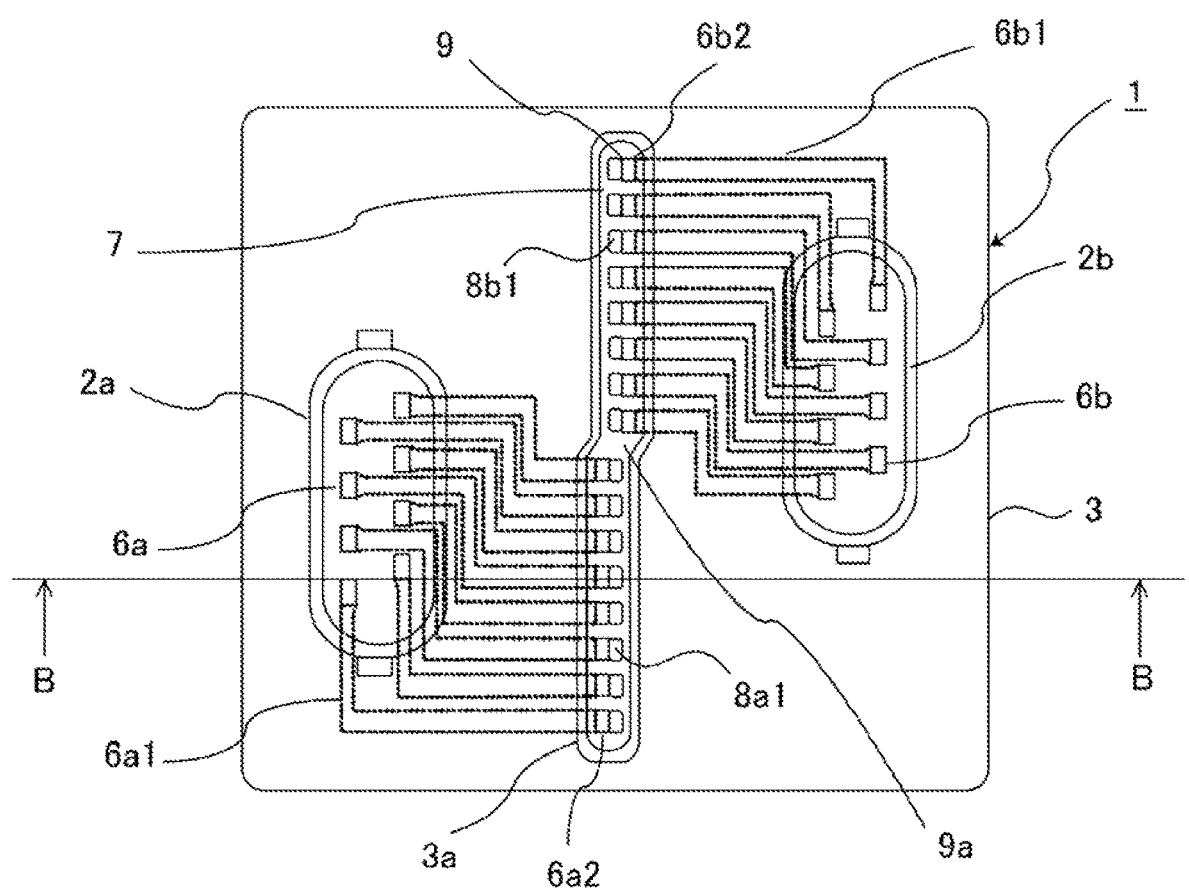
FIG. 3 is a planar perspective view showing a configuration of an electronic control device according to a second embodiment.
Figure 4:
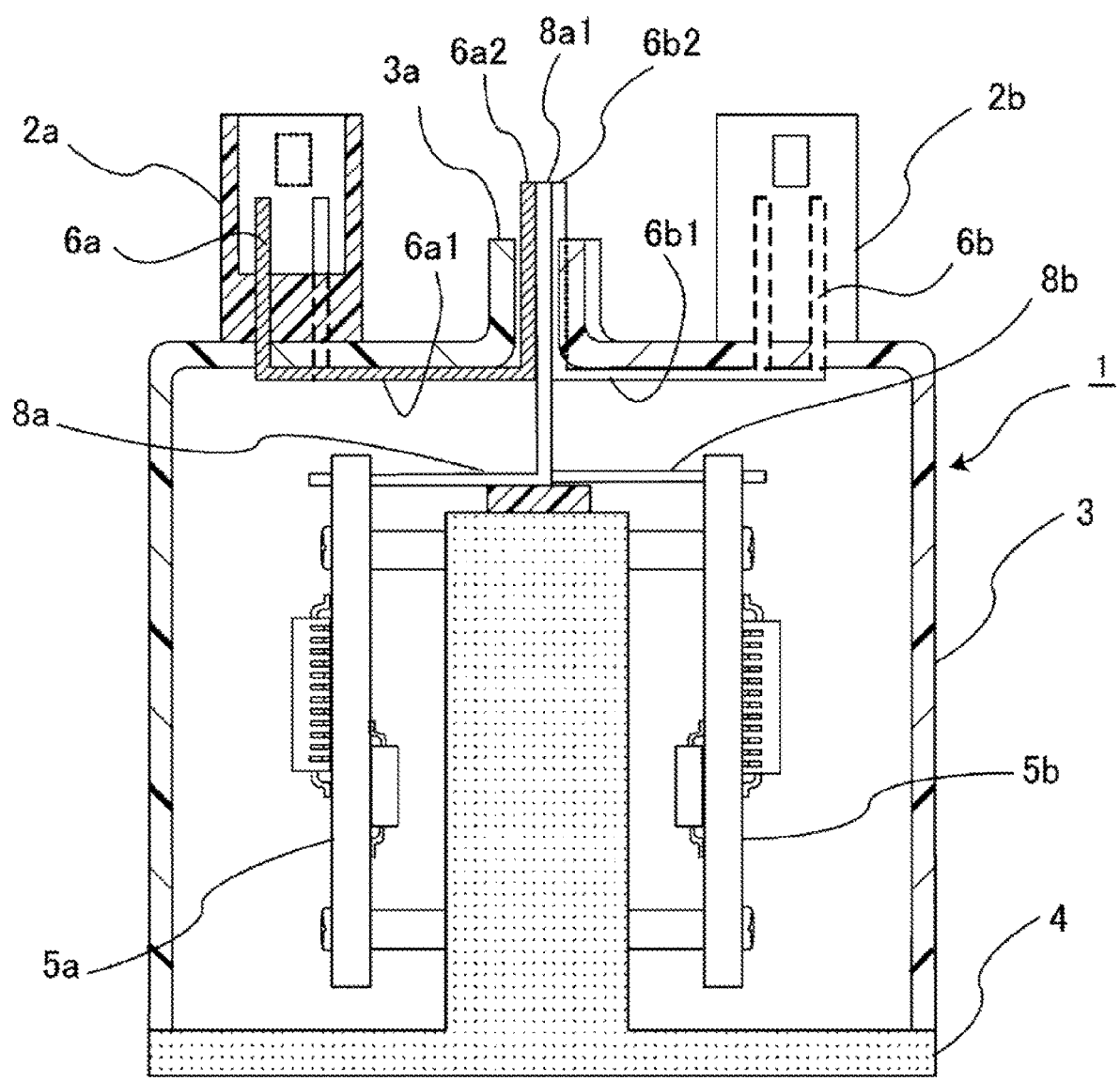
FIG. 4 is a sectional view along B-B of FIG. 3.

FIG. 3 and FIG. 4 show the electronic control device according to the second embodiment, wherein FIG. 3 is a planar perspective view, and FIG. 4 is a sectional view along B-B of FIG. 3.

In FIG. 3 and FIG. 4, the electronic control device 1 according to the second embodiment includes the connectors 2a and 2b, the connector case 3, the base 4, and the control boards 5a and 5b, in the same way as in the first embodiment. A large number of connector terminals 6a and 6b exist in the connectors 2a and 2b, and in order to wire from each connector terminal to the control boards 5a and 5b, firstly, the first extended terminals 6a1 and 6b1 extend from the connector terminals 6a and 6b to the hole 7 formed in an elliptical shape in the center of the top plate portion of the connector case 3. Further, the first extended terminals 6a1 and 6b1 become the first externally extending terminals 6a2 and 6b2 and are exposed further upward than the wall portion 3a of the connector case 3 toward the upward exterior from the hole 7, and form exposed faces of the same height.

The length direction sectional form of the first extended terminals 6a1 and 6b1 is a quadrilateral form.

Also, as seen in FIG. 3, an end face form of the wall portion 3a of the connector case 3 is an elliptical form that deviates slightly horizontally due to the separating portion 9a formed in a length direction central portion, and the hole 7 enclosed by the wall portion 3a of the connector case 3 deviates slightly horizontally due to the separating portion 9a. That is, the hole 7 is formed in an elliptical form that is long in a direction perpendicular to the direction in which the first externally extending terminals 6a2 and 6b2 or the second externally extending terminals 8a1 and 8b1 are opposed, and deviates in the direction in which the first externally extending terminals 6a2 and 6b2 or the second externally extending terminals 8a1 and 8b1 are opposed in a longitudinal direction central portion of the hole 7, and the end face form of the wall portion 3a of the connector case 3 is an elliptical form that deviates slightly horizontally due to the separating portion 9a formed in the length direction central portion. The first extended terminals 6a1 and 6b1 are desirably configured integrated with the connector terminals 6a and 6b respectively.

Meanwhile, the second extended terminals 8a and 8b extend toward the center from the upper end portions of the control boards 5a and 5b respectively, are bent in the same position in a vicinity of the center, form the second externally extending terminals 8a1 and 8b1, and extend upward on an approximate straight line. The foremost end portions of the second externally extending terminals 8a1 and 8b1 are exposed from the wall portion 3a of the connector case 3.

As the second externally extending terminals 8a1 and 8b1 are aligned on an approximate straight line, the first extended terminal 6a1 from the connector 2a is bent in a position on the left side of the second externally extending terminal 8a1 in FIG. 3 and FIG. 4, extends from the hole 7 to become the first externally extending terminal 6a2, and is in contact with the second externally extending terminal 8a1. In the same way, the first externally extending terminal 6b1 from the connector 2b is bent in a position on the right side of the second externally extending terminal 8b1 in FIG. 3 and FIG. 4, extends from the hole 7 to become the first externally extending terminal 6b2, and is in contact with the second externally extending terminal 8b1.

As the second externally extending terminals 8a1 and 8b1 are aligned on an approximate straight line, the first extended terminals 6a1 and 6b1 of the connectors 2a and 2b extend from the left and right respectively, and the first externally extending terminals 6a2 and 6b2 are in contact with the second externally extending terminals 8a1 and 8b1, the hole 7 and the contact portion 9 deviate by an amount equivalent to a terminal thickness owing to the separating portion 9a.

As heretofore described, the electronic control device 1 according to the second embodiment is such that the second extended terminals 8a and 8b of the control boards 5a and 5b each extend toward the center, are bent in the same position in a vicinity of the center, form the second externally extending terminals 8a1 and 8b1, and extend upward on an approximate straight line. Also, the first extended terminal 6a1 from the connector 2a is bent in a position on the left side of the second externally extending terminal 8a1, becomes the first externally extending terminal 6a2, and is in contact with the second externally extending terminal 8a1, and the first extended terminal 6b1 from the connector 2b is bent in a position on the right side of the second externally extending terminal 8b1, becomes the first externally extending terminal 6b2, and is in contact with the second externally extending terminal 8b1.

Because of this, even though the separating portion 9a exists in the contact portion 9, connection (welding, soldering, or the like) of the contact portion 9 is easy, and connection can be carried out using a working method akin to a single stroke of a brush. Consequently, connection machinability improves. Furthermore, provided that the connectors 2a and 2b, and the control boards 5a and 5b, have exactly the same functions and are of exactly the same configurations, the second extended terminals 8a and 8b have identical forms, and portions extended upward from bent portions, that is, the second externally extending terminals 8a1 and 8b1, are on an approximate straight line, because of which manufacturing and assembly are easy.

Third Embodiment

Next, an electronic control device according to a third embodiment will be described.

Figure 5:
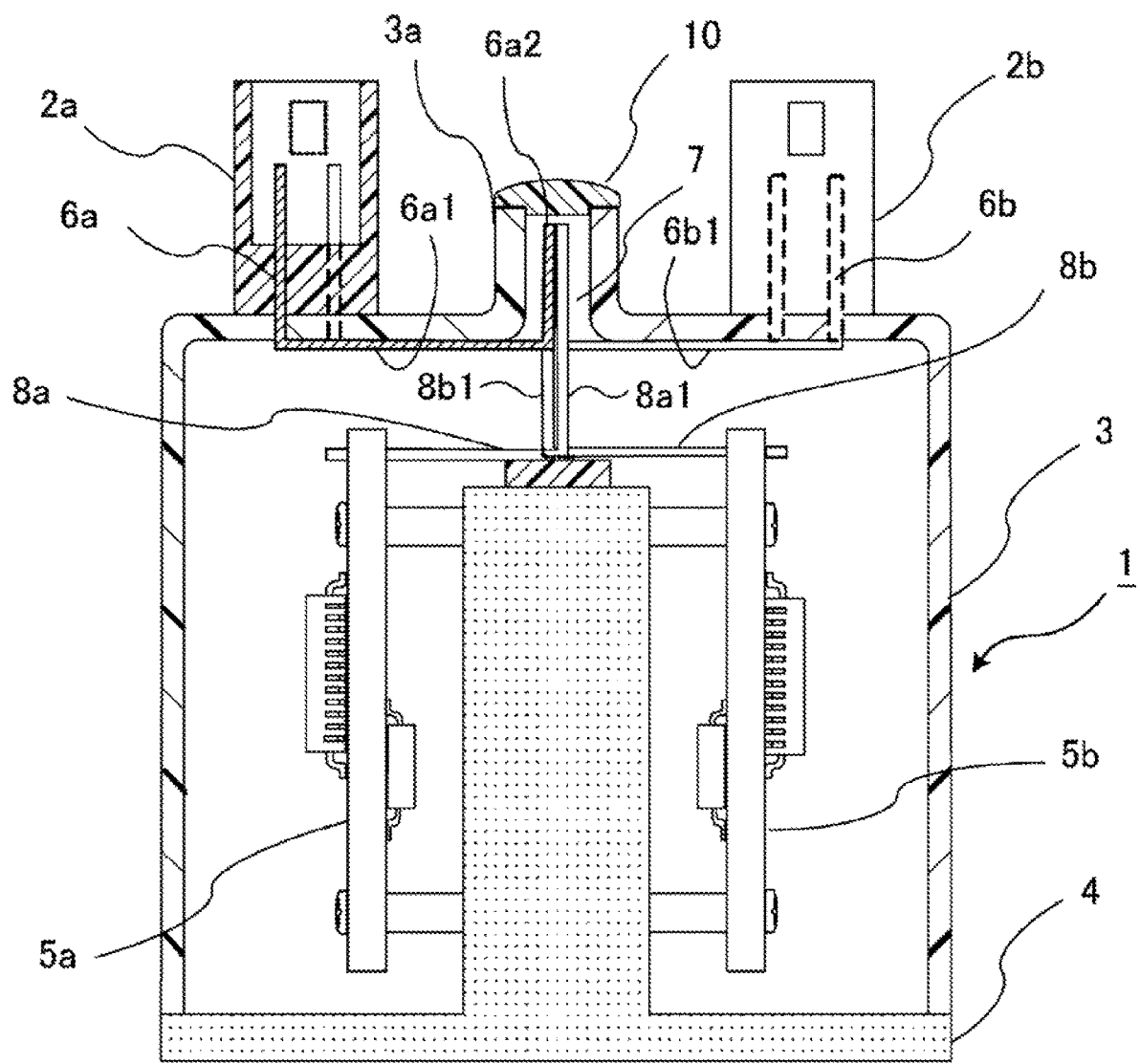
FIG. 5 is a view corresponding to FIG. 4 of an electronic control device according to a third embodiment.

FIG. 5 is a sectional view of the electronic control device according to the third embodiment. Differences from the first embodiment are that a width of the hole 7 formed on an approximate straight line in the center of the top plate portion of the connector case 3 is greater than in the first embodiment, and that the heights of the leading end portions of each of the first externally extending terminals 6a2 and 6b2 and the second externally extending terminals 8a1 and 8b1 are formed to be lower than the height of the wall portion 3a of the connector case 3, and a cover 10 is provided on the wall portion 3a. As other configurations are the same as in the first embodiment, the same reference signs are allotted, and a description thereof will be omitted.

As the electronic control device 1 according to the third embodiment is such that the width of the hole 7 formed in the center of the top plate portion of the connector case 3 is greater than in the first embodiment, the leading end portions of the first externally extending terminals 6a2 and 6b2 and the second externally extending terminals 8a1 and 8b1 are stopped in positions not exposed above the upper face of the wall portion 3a, and the first externally extending terminal 6a2 and the second externally extending terminal 8a1, and the first externally extending terminal 6b2 and the second externally extending terminal 8b1, can be welded or soldered. Further, the leading end portions of the first externally extending terminals 6a2 and 6b2, the leading end portions of the second externally extending terminals 8a1 and 8b1, the hole 7, and the upper face of the wall portion 3a, can subsequently be covered with the cover 10.

When waterproofing is particularly needed, a waterproofed structure can be obtained by a waterproofing sealing member being applied between the upper face of the wall portion 3a and a lower face of an outer peripheral edge of the cover 10.

According to the electronic control device 1 according to the third embodiment, as heretofore described, the leading end portions of each of the first externally extending terminals 6a2 and 6b2 and the second externally extending terminals 8a1 and 8b1 are stopped in positions lower than the wall portion 3a of the connector case 3, and when the hole 7 is blocked off by the cover 10 after the first externally extending terminal 6a2 and the second externally extending terminal 8a1, and the first externally extending terminal 6b2 and the second externally extending terminal 8b1, are electrically connected, a form of the cover 10 can be simplified because the hole 7 is formed on an approximate straight line, and there is no unevenness in the upper face of the wall portion 3a. Because of this, there is an advantage in that a waterproofed structure can be formed easily.

Fourth Embodiment

Next, an electronic control device according to a fourth embodiment will be described.

Figure 6:
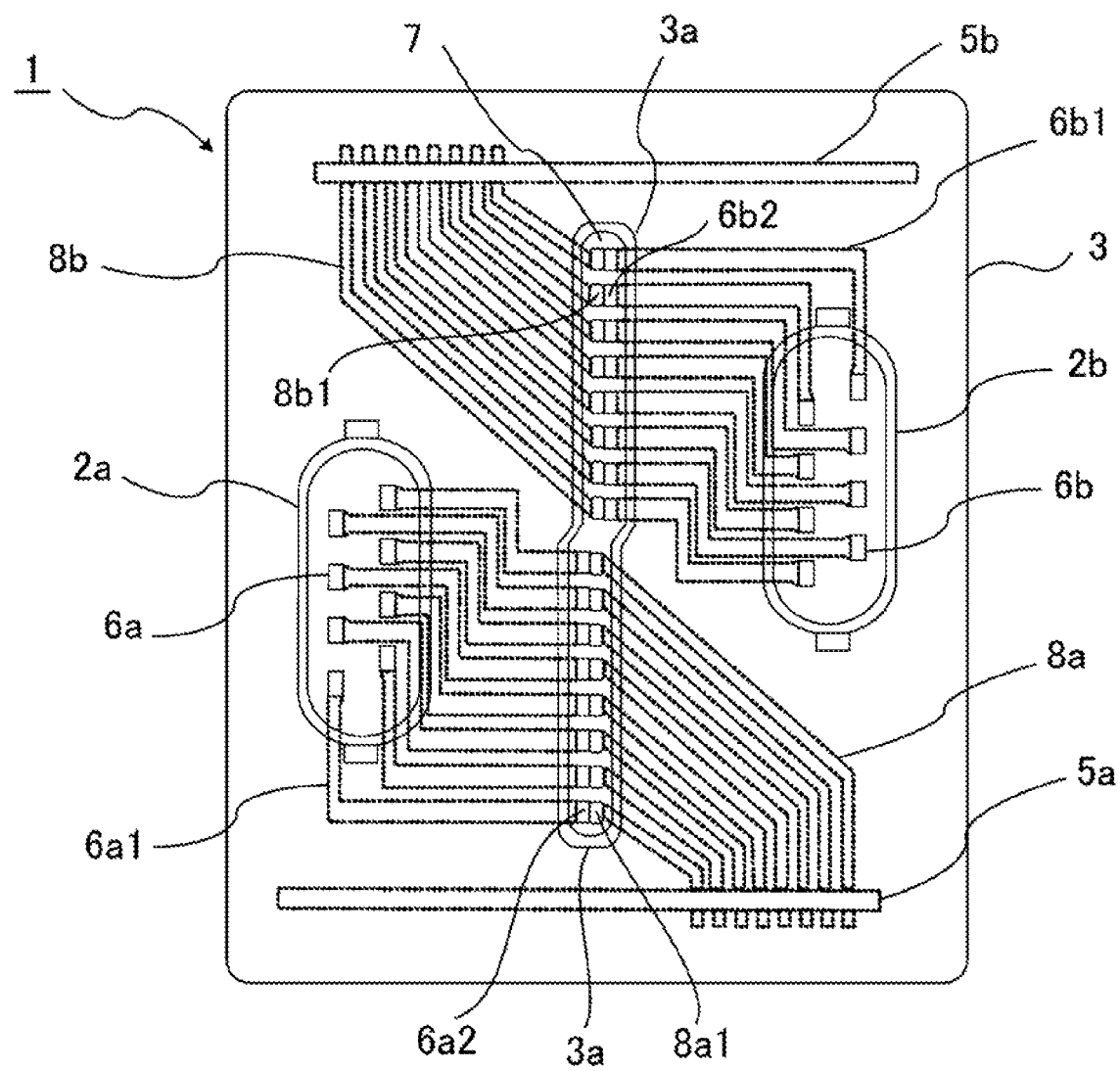
FIG. 6 is a planar perspective view showing a configuration of an electronic control device according to a fourth embodiment.
Figure 7:
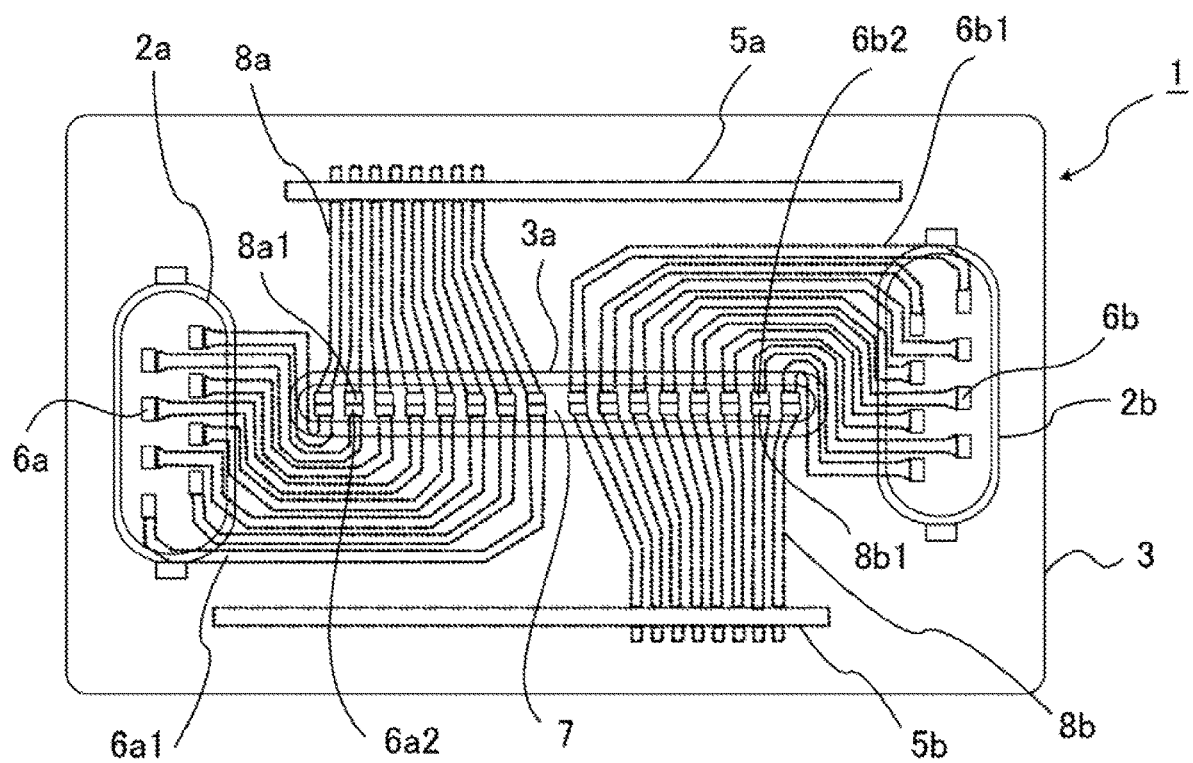
FIG. 7 is a planar perspective view showing a configuration of another example of an electronic control device according to the fourth embodiment.

FIG. 6 and FIG. 7 are planar perspective views showing a configuration of the electronic control device according to the fourth embodiment. The electronic control device 1 shown in FIG. 6 is such that the connectors 2a and 2b are disposed approximately opposing, and the control boards 5a and 5b are also disposed opposing in an interior of the electronic control device 1. The control boards 5a and 5b and the connectors 2a and 2b are configured in dispositions whose orientations differ by approximately 90 degrees. The hole 7 is disposed approximately perpendicularly to the control boards 5a and 5b in a central portion. As other configurations are the same as in the first embodiment shown in FIG. 1 and FIG. 2, the same reference signs are allotted, and a description thereof will be omitted.

The first extended terminal 6a1 extended from the connector terminal 6a approaches the hole 7 formed in the center of the top plate portion of the connector case 3 from the left side in FIG. 6, while the second extended terminal 8a extended from the control board 5a approaches the hole 7 formed in the center of the top plate portion of the connector case 3 from the right side in FIG. 6. The first extended terminal 6a1 and the second extended terminal 8a are bent in a center of the hole, and are extended to the exterior of the electronic control device 1 as the first externally extending terminal 6a2 and the second externally extending terminal 8a1 respectively, whereby end portions of the two are exposed. The exposed first externally extending terminal 6a2 and second externally extending terminal 8a1 are connected to each other. Also, connection of the connector 2b and the control board 5b is disposed and configured in the same way.

In FIG. 5, the control boards 5a and 5b and the hole 7 formed in the center of the top plate portion of the connector case 3 are disposed in parallel, and the connectors 2a and 2b are disposed approximately vertically with respect to the hole 7. With this kind of disposition too, the first extended terminals 6a1 and 6b1 from the connector 2a and 2b and the second extended terminals 8a and 8b from the control boards 5a and 5b extend so as to oppose each other, are bent in the center of the hole 7, and extended as the first externally extending terminals 6a2 and 6b2 and the second externally extending terminals 8a1 and 8b1, and the first externally extending terminal 6a2 and the second externally extending terminal 8a1, and the first externally extending terminal 6b2 and the second externally extending terminal 8b1, are in contact with each other.

When the two opposingly disposed connectors 2a and 2b and the two opposingly disposed control boards 5a and 5b are electrically connected using the first extended terminals 6a1 and 6b1 and the second extended terminals 8a and 8b, as heretofore described, the first externally extendingXX terminals 6a1 and 6b1 and the second externally extendingXX terminals 8a and 8b are extended opposing to the hole 7 formed in the center of the top plate portion of the connector case 3, and are bent toward the exterior in the center of the hole 7 and extended, configuring the first externally extending terminals 6a2 and 6b2 and the second externally extending terminals 8a1 and 8b1. Further, the contact portions of the leading ends of the first externally extending terminal 6a2 and the second externally extending terminal 8a1, and of the first externally extending terminal 6b2 and the second externally extending terminal 8b1, are welded or soldered. Consequently, not only is connection carried out with a simple structure, but a connection method is also such that the process can be carried out as though with one stroke of a brush, and machinability improves. Also, a cover that covers the contact portions of the leading ends of the first externally extending terminal 6a2 and the second externally extending terminal 8a1 and of the first externally extending terminal 6b2 and the second externally extending terminal 8b1, the wall portion 3a of the connector case 3, and the hole 7 can be disposed.

Although the present application is described in terms of various exemplifying embodiments and implementations, the various features, aspects, and functions described in one or a multiple of embodiments are not limited in their applicability to a particular embodiment, but instead can be applied, alone or in various combinations, to other embodiments.

It is therefore understood that numerous modifications that have not been exemplified can be devised without departing from the scope of the present application. For example, at least one constituent component may be modified, added, or eliminated, and furthermore, at least one of the constituent components may be selected and combined with the constituent components of another embodiment.

REFERENCE SIGNS LIST 1 electronic control device, 2a, 2b connector, 3 connector case, 3a wall portion, 4 base, 5a, 5b control board, 6a, 6b connector terminal, 6a1, 6b1 first externally extending terminal, 6a2, 6b2 first externally extending terminal, 7 hole, 8a, 8b second extended terminal, 8a1, 8b1 second externally extending terminal, 9 contact portion, 9a separating portion, 10 cover.

The invention claimed is:

1. An electronic control device, comprising:
a connector case;
connectors disposed opposing in an exterior of the connector case and each having a multiple of terminals;
control boards disposed opposing in an interior of the connector case;
first extended terminals extended from the multiple of terminals of the opposing connectors respectively; and
second extended terminals extended from the opposing control boards respectively, wherein
a hole is formed between the opposing connectors in the connector case, each of the first extended terminals and each of the second extended terminals oppose and approach each other toward the hole, and first externally extending terminals of the first extended terminals and second externally extending terminals of the second extended terminals are formed to penetrate the hole and exit to the exterior of the connector case from the hole, and pairs of the first externally extending terminals contact each other along first side faces thereof, and pairs of the second externally extending terminals contact each other along second side faces thereof that are opposite the first side faces.

2. The electronic control device according to claim 1, wherein one of the second extended terminals and the other of the second extended terminals have a separating portion in a direction perpendicular to a direction of opposition,
one of the first externally extending terminals comes into contact with one of the second externally extending terminals, and the other of the first externally extending terminals comes into contact with the other of the second externally extending terminals.

3. The electronic control device according to claim 2, wherein the hole is formed so as to have a long diameter in a direction perpendicular to the direction of opposition of the first externally extending terminals or the second externally extending terminals, in addition to which a wall portion is disposed protruding from the connector case in a periphery of the hole, and
respective contact portions of the first externally extending terminal and the second externally extending terminal and the other of the first externally extending terminal and the second externally extending terminal protrude further to the exterior than the wall portion.

4. The electronic control device according to claim 3, wherein the terminals of the connectors, the first extended terminals and the first externally extending terminals, and the second extended terminals and the second externally extending terminals, are each configured of the same member.

5. The electronic control device according to claim 2, wherein a height of a leading end portion of each of the first externally extending terminals and the second externally extending terminals is formed to be lower than a height of a wall portion of the connector case, in addition to which a cover that covers the wall portion is provided.

6. The electronic control device according to claim 5, wherein the terminals of the connectors, the first extended terminals and the first externally extending terminals, and the second extended terminals and the second externally extending terminals, are each configured of the same member.

7. The electronic control device according to claim 2, wherein the terminals of the connectors, the first extended terminals and the first externally extending terminals, and the second extended terminals and the second externally extending terminals, are each configured of the same member.

8. The electronic control device according to claim 1, wherein one of the second externally extending terminals and the other of the second externally extending terminals are aligned on a line that can be considered to be a straight line, one of the first externally extending terminals comes into contact with one of the second externally extending terminals, and the other of the first externally extending terminals comes into contact with the other of the second externally extending terminals.

9. The electronic control device according to claim 8, wherein the hole has a long diameter in a direction perpendicular to the direction of opposition of the first externally extending terminals or the second externally extending terminals, and is formed in a form that deviates in the direction of opposition of the first externally extending terminals or the second externally extending terminals in a longitudinal direction central portion of the hole, in addition to which a wall portion is disposed protruding from the connector case in a periphery of the hole, and respective contact portions of the first externally extending terminal and the second externally extending terminal and the other of the first externally extending terminal and the second externally extending terminal protrude further to the exterior than the wall portion.

10. The electronic control device according to claim 9, wherein the terminals of the connectors, the first extended terminals and the first externally extending terminals, and the second extended terminals and the second externally extending terminals, are each configured of the same member.

11. The electronic control device according to claim 8, wherein the hole is formed so as to have a long diameter in a direction perpendicular to the direction of opposition of the first externally extending terminals or the second externally extending terminals, in addition to which a wall portion is disposed protruding from the connector case in a periphery of the hole, and
respective contact portions of the first externally extending terminal and the second externally extending terminal and the other of the first externally extending terminal and the second externally extending terminal protrude further to the exterior than the wall portion.

12. The electronic control device according to claim 11, wherein the terminals of the connectors, the first extended terminals and the first externally extending terminals, and the second extended terminals and the second externally extending terminals, are each configured of the same member.

13. The electronic control device according to claim 8, wherein a height of a leading end portion of each of the first externally extending terminals and the second externally extending terminals is formed to be lower than a height of a wall portion of the connector case, in addition to which a cover that covers the wall portion is provided.

14. The electronic control device according to claim 13, wherein the terminals of the connectors, the first extended terminals and the first externally extending terminals, and the second extended terminals and the second externally extending terminals, are each configured of the same member.

15. The electronic control device according to claim 8, wherein the terminals of the connectors, the first extended terminals and the first externally extending terminals, and the second extended terminals and the second externally extending terminals, are each configured of the same member.

16. The electronic control device according to claim 1, wherein the hole is formed so as to have a long diameter in a direction perpendicular to the direction of opposition of the first externally extending terminals or the second externally extending terminals, in addition to which a wall portion is disposed protruding from the connector case in a periphery of the hole, and
  respective contact portions of the first externally extending terminal and the second externally extending terminal and the other of the first externally extending terminal and the second externally extending terminal protrude further to the exterior than the wall portion.

17. The electronic control device according to claim 16, wherein the terminals of the connectors, the first extended terminals and the first externally extending terminals, and the second extended terminals and the second externally extending terminals, are each configured of the same member.

18. The electronic control device according to claim 1, wherein a height of a leading end portion of each of the first externally extending terminals and the second externally extending terminals is formed to be lower than a height of a wall portion of the connector case, in addition to which a cover that covers the wall portion is provided.

19. The electronic control device according to claim 18, wherein the terminals of the connectors, the first extended terminals and the first externally extending terminals, and the second extended terminals and the second externally extending terminals, are each configured of the same member.

20. The electronic control device according to claim 1, wherein the terminals of the connectors, the first externally extending terminals and the first extended terminals, and the second externally extending terminals and the second extended terminals, are each configured of the same member.

* * * * *